United States Patent
Dehos et al.

(10) Patent No.: US 9,419,673 B2
(45) Date of Patent: Aug. 16, 2016

(54) MILLIMETER BAND TRANSMITTING/RECEIVING SYSTEM

(71) Applicant: COMMISSARIAT A L'ENERGIE ATOMIQUE ET AUX ENERGIES ALTERNATIVES, Paris (FR)

(72) Inventors: Cedric Dehos, Douarnenez (FR); Laurent Dussopt, Grenoble (FR); Alexandre Siligaris, Grenoble (FR); Pierre Vincent, Villard de Lans (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 17 days.

(21) Appl. No.: 14/386,749

(22) PCT Filed: Mar. 21, 2013

(86) PCT No.: PCT/EP2013/055987
§ 371 (c)(1),
(2) Date: Sep. 19, 2014

(87) PCT Pub. No.: WO2013/139939
PCT Pub. Date: Sep. 26, 2013

(65) Prior Publication Data
US 2015/0079912 A1 Mar. 19, 2015

(30) Foreign Application Priority Data
Mar. 23, 2012 (FR) ...................................... 12 52650

(51) Int. Cl.
*H04B 1/40* (2015.01)
*H04B 1/408* (2015.01)
(Continued)

(52) U.S. Cl.
CPC ................ *H04B 1/408* (2013.01); *H01L 23/66* (2013.01); *H01L 25/16* (2013.01);
(Continued)

(58) Field of Classification Search
CPC ...... H04B 1/408; H04B 1/0483; H01Q 23/00; H01L 2223/6677
USPC ........................................................ 455/76
See application file for complete search history.

(56) References Cited

U.S. PATENT DOCUMENTS 7,808,798 B2  10/2010  Cotte et al.
2009/0061795 A1  3/2009  Doan et al.
(Continued)

FOREIGN PATENT DOCUMENTS

EP  0476675 A1  3/1992
EP  1162754 A2  12/2001
(Continued)

*Primary Examiner* — Eugene Yun
(74) *Attorney, Agent, or Firm* — Baker & Hostetler LLP

(57) ABSTRACT

In the field of millimeter band transmitting/receiving systems for a high-speed contactless transmission, an architecture is provided with a common processing circuit supplying modulation signals and a plurality of transmitting/receiving integrated circuits, all identical to one another, receiving these signals, and also a common clock. The transmitting/receiving integrated circuits each comprise: an oscillator locked with the clock signal to produce a carrier frequency, a transmit channel comprising a first controllable phase shift circuit, a frequency transposition to the carrier frequency, and a power amplifier, a receive channel comprising a low noise amplifier, a frequency transposition from the carrier frequency, and a second controllable phase shift circuit. An antenna is associated with each transmitting/receiving circuit.

12 Claims, 3 Drawing Sheets

(51) Int. Cl.
*H01L 23/66* (2006.01)
*H01L 25/16* (2006.01)
*H01Q 23/00* (2006.01)
*H04B 1/04* (2006.01)

(52) U.S. Cl.
CPC .......... *H01L 2223/6677* (2013.01); *H01L 2224/16225* (2013.01); *H01L 2924/15192* (2013.01); *H01L 2924/15321* (2013.01); *H01Q 23/00* (2013.01); *H04B 1/0483* (2013.01)

(56) References Cited

U.S. PATENT DOCUMENTS

2010/0159829 A1  6/2010  McCormack
2011/0254727 A1  10/2011  Kam et al.

FOREIGN PATENT DOCUMENTS

EP   1486796 A2   12/2004
WO   0074170 A2   12/2000

MILLIMETER BAND TRANSMITTING/RECEIVING SYSTEM

CROSS-REFERENCE TO RELATED APPLICATIONS

This application is a National Stage of International patent application PCT/EP2013/055987, filed on Mar. 21, 2013, which claims priority to foreign French patent application No. FR 1252650, filed on Mar. 23, 2012, the disclosures of which are incorporated by reference in their entirety.

FIELD OF THE INVENTION

The invention relates to millimeter band transmitting/receiving systems intended to transmit and receive high-speed data between two devices not electrically connected but close or very close to one another (from a few millimeters to a few meters).

BACKGROUND

The applications of these systems entail the transmission of high-speed data between two mobile devices (two portable telephones, for example) or a mobile device and a fixed device (a portable telephone and a computer, for example), contactless transmission between two electronic chips or two chip cards, transmission of a video stream between an Internet network connection box (set top box) and a television receiver, etc.

The millimeter band considered in this invention is a frequency band generally referred to as the 60 GHz band, i.e. radio carrier frequencies between 57 and 66 GHz, but the invention would also be applicable to other frequency bands, both below 57 GHz and above 66 GHz, for example from 10 to 100 GHz.

The term 60 GHz signal will be used below for simplicity to qualify the radio frequency signal transmitted or received by radio link.

In the prior art, implementations have been proposed which differ from one another according to the desired transmission range.

When the range is very short, in the region of a few millimeters, each card has a transmitting/receiving integrated circuit connected to a respective antenna. This is the case, for example, when a communication is to be established between two chip cards: they are brought quite close to one another and their antennas are located a few millimeters at most from one another. The transmitting/receiving circuits and the antennas to some extent replace an electrical connection by direct contact. The patent publication US2010159829 and the U.S. Pat. No. 7,808,798 describe transmitting/receiving circuits in this context.

When the range is longer (several tens of centimeters to several meters), it has already been proposed to transmit or receive the radio frequency signal in parallel on N channels connected respectively to N antennas; a directional beamformation effect is produced by a control of the phase shifts of the carrier frequency in each of the channels.

For transmission, a processor produces a baseband modulation signal, which is then frequency-transposed by a 60 GHz radio frequency transmitter. The signal is then divided among N channels by power dividers, and is then selectively phase-shifted on each channel and amplified to be fed to a respective antenna.

Similarly, on reception, a network of N antennas (which may be the same as the transmit antennas) receives the signal and feeds it to a series of N amplifiers and phase shifters; the phase shifters serve to compensate individually the phase differences of the signals received by the different antennas in one spatial direction; the phase-shifted signals are recombined by a combiner (similar to the power divider which is used for transmission, but operating in the opposite direction), before entering a radio frequency receiver which carries out the frequency transposition to the baseband, and then entering the signal processing processor.

In this architecture, the signal processor which generates the radio frequency signal or which receives the recombined signal, the power splitter, the combiner, and each of the transmitting/receiving circuits which selectively phase-shift and amplify the signal transmitted or received by a respective antenna are assembled on the same integrated circuit chip. The antennas are preferably implemented outside the integrated circuit due to the fact that the silicon substrate of the integrated circuit does not lend itself well to an antenna usage (it is generally too conductive). The antennas may be formed on a standard plastic or ceramic printed circuit board, on which the integrated circuit is disposed.

This beam-forming architecture for a long-range communication results in a large-surface and therefore costly integrated circuit chip, which may be acceptable for a long-range communication but is unacceptable for a short or medium-range communication, since the latter can be implemented with a much cheaper integrated circuit chip. Moreover, this architecture is not versatile, since a costly development must be repeated for each new application. Patent publication US20090061795 describes an example of an architecture of this type.

SUMMARY OF THE INVENTION

The object of the invention is to propose a different architecture allowing design costs to be reduced and the costs of implementing a millimeter band transmitting/receiving system to be optimized. It can even be used for short-range applications. In this new architecture, a transmitting/receiving integrated circuit will be associated with each antenna; the integrated circuits will receive a baseband modulation signal and will individually carry out a controlled phase shift of the signal then a transposition to the carrier frequency based on a frequency synthesis carried out in the circuit itself.

For this purpose, the invention proposes a contactless millimeter band transmitting/receiving system for a high-speed data transmission, including a common processing circuit supplying modulation signals and a plurality of transmitting/receiving integrated circuits, all identical to one another, electrically connected to the common processing circuit in order to receive from it the modulation signals and moreover all receiving a clock signal originating from a common clock signal source, the transmitting/receiving integrated circuits each comprising:

an oscillator locked with the clock signal to produce a carrier frequency which is a multiple of the clock signal,
  a transmit channel comprising a first controllable phase shift circuit, a first circuit for frequency transposition to the carrier frequency, and a power amplifier,
  a receive channel comprising a low noise amplifier, a second circuit for frequency transposition from the carrier frequency, and a second controllable phase shift circuit,
  the system also comprising, for each transmitting/receiving integrated circuit, at least one respective antenna connected to the transmit and receive channels of this circuit.

Consequently, the system does not comprise a common circuit which would have a single oscillator locked with the clock signal and a single circuit for frequency transposition between the baseband and the carrier frequency. On the contrary, there is an oscillator and a transposition circuit in each transmitting/receiving integrated circuit. Only the clock is common and serves as a reference clock. The modulation signal which is directed towards the different transmitting/receiving circuits is in the baseband and not at the carrier frequency; it is not therefore necessary to provide a power splitter or combiner at the carrier frequency to guide the modulated signals to each of the transmitting phase-shifters or to recombine the signals originating from the receiving phase shifters. Finally, in the architecture according to the invention, the phase shifters operate in the baseband and not at the carrier frequency.

The oscillator present in each integrated circuit is preferably a phase-locked loop (PLL) receiving the clock signal.

The antenna is preferably located outside the transmitting/receiving integrated circuit with which it is associated. It is connected to an input/output terminal of the integrated circuit, which is an antenna connection terminal used for both transmission and reception.

This connection terminal is preferably connected to a transmitting/receiving switch forming part of the transmitting/receiving integrated circuit; this switch connects the antenna either to the output of the power amplifier of the transmit channel or to the input of the low noise amplifier of the receive channel.

The transmitting/receiving integrated circuits are preferably disposed on a back surface of a high-resistivity silicon wafer comprising on this back surface a network of interconnection conductors connected to the integrated circuits, the antennas being formed on the front surface and been connected to the network of conductors via conductor paths crossing the entire thickness of the wafer. The silicon wafer is itself preferably disposed on a printed circuit board.

Further preferably, each transmitting/receiving integrated circuit comprises a transmission and reception gain control to optimize consumption when it is not necessary to use all the available transmission power. The electrical power supply of each of the transmitting/receiving circuits or at least of the transmit and receive amplifiers can also be switched off if it is not necessary to use all the transmit and receive circuits, for example in the case of good communication conditions.

The fact that the carrier frequency is produced separately in each transmitting/receiving circuit engenders a risk that the different carrier frequencies are not all in-phase. Consequently, the phase shift controls applied by the common circuit to adjust the overall radiation pattern run the risk in reality of producing phase shifts that are not the desired phase shifts.

It is therefore desirable to calibrate the system to compensate the intrinsic phase shifts introduced by the locked oscillators either due to their nature or due to the geographical positions of the integrated circuits in the system.

This is why the system preferably includes calibration means for determining, in a calibration phase, the actual phase shifts of the carrier frequencies produced by the different integrated circuits. The calibration phase may be single or regularly repeated with each new communication between two systems, or even repeated during real communications between the systems.

In one preferred version, the means for determining the carrier frequency phase shifts include, in the case where there are N transmitting/receiving integrated circuits:

means for applying to the transmit channel of the N circuits a sequence of N successive test signal samples, represented by a vector X comprising N components, means for applying a set of N simple phase shifts to the N phase shift circuits of the transmit channels at the time of the transmission of a sample, the set of N simple phase shifts being chosen from the N possible sets differing from one another and orthogonal in relation to one another, the N sets being applied successively in synchronism with the application of the N samples of the sequence, means for collecting a vector Y of N corresponding successive signal samples on the receive channel coupled to the transmit channel, and means for calculating a vector $\phi$ of phase shifts of the carrier frequencies of the N circuits by means of an equation $\phi=(1/2N)^t H \cdot Y \otimes (1/X)$, where $^t H$ denotes the transpose of a matrix H representing the N possible sets of N phase shifts, 1/X denotes a vector of which the components are the inverse of each of the components of the vector X, and the symbol $\otimes$ denotes a term-by-term multiplication of the vector components, the period representing a matrix multiplication.

The vectors of the matrix H are orthogonal in relation to the canonical scalar product.

The invention also relates to a method for using a contactless millimeter band transmitting/receiving system for a high-speed data transmission, including a common processing circuit supplying modulation signals and a plurality of transmitting/receiving integrated circuits all identical to one another, electrically connected to the common processing circuit to receive the modulation signals from it, moreover all receiving a clock signal originating from a common clock signal source, the integrated circuits each being connected to at least one respective antenna and each including a phase-locked loop, frequency transposition circuits and controllable phase shift circuits, the method being characterized in that it includes a calibration step for determining actual phase shifts of the different integrated circuits, connected to the structure and to the position of the integrated circuits in the system, a storage in a memory of these phase shifts, and a subsequent use of the phase shifts stored in a memory in order to modify the phase shift controls supplied to the integrated circuits by the common processing circuit.

BRIEF DESCRIPTION OF THE DRAWINGS

Other characteristics and advantages of the invention will become apparent from a reading of the detailed description which follows, given by way of a non-limiting example, with reference to the attached drawings, in which.

DETAILED DESCRIPTION

Figure 1:
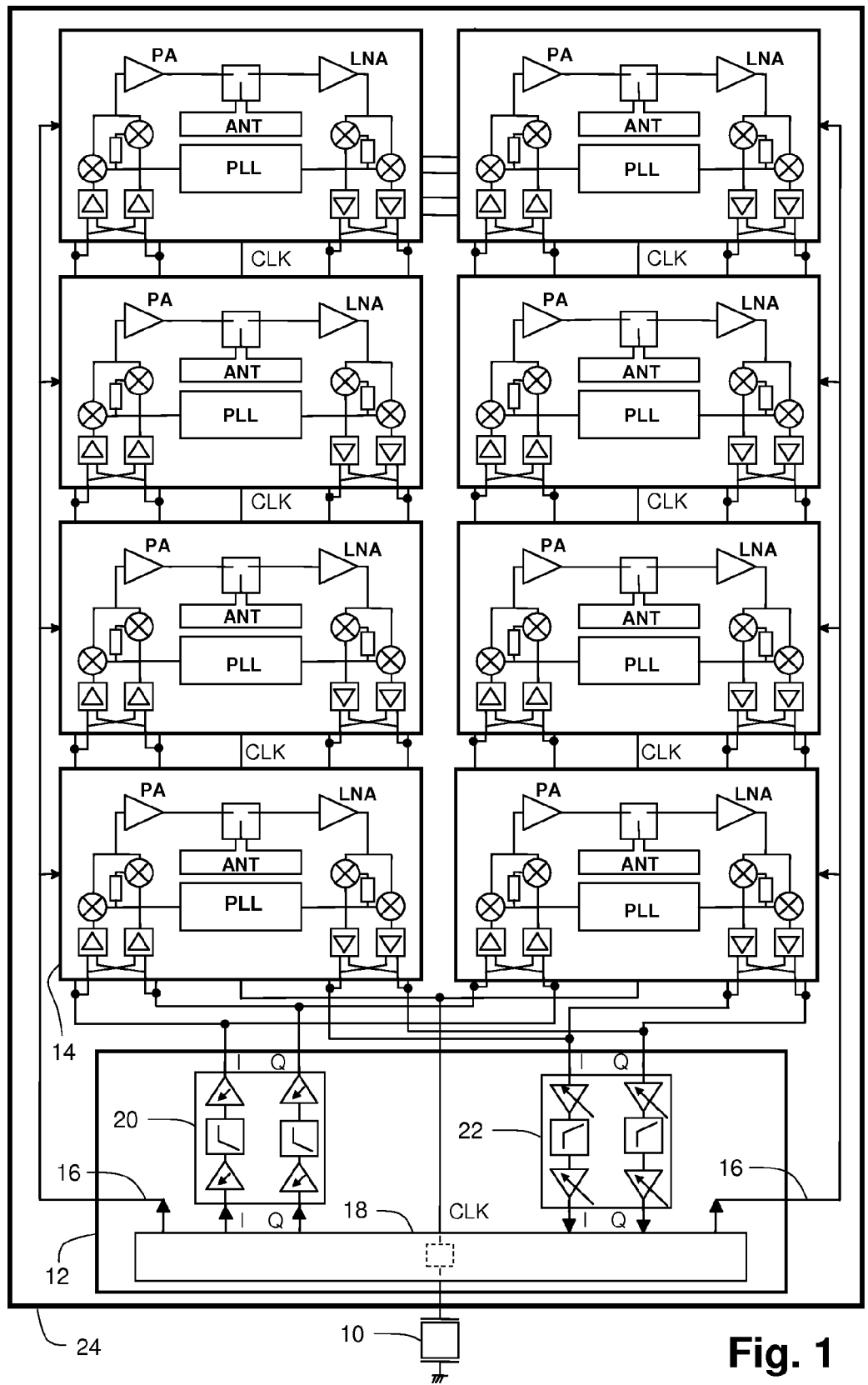
FIG. 1 shows the general architecture of the integrated circuit according to the invention.

The general architecture of the transmitting/receiving system according to the invention is shown in FIG. 1, in an example configuration in which there are eight transmit antennas enabling a beam formation through action on the relative phase shifts of the carrier frequencies transmitted by the eight antennas.

The expression "beam formation" refers here to an action on the overall radiation pattern of the array formed by the eight antennas transmitting the same modulated signal or receiving the same signal. The pattern is directive, in principle with a main lobe in a given direction; an appropriate choice of the relative phase shifts of the carrier frequencies transmitted by the different antennas allows the direction of the main lobe to be modified.

Existing millimeter band communication standards specify a protocol for beam formation at the beginning of a communication between two systems, and a protocol for monitoring during the communication, in order to adjust the radiation pattern of each system according to the relative positions of the two systems, in such a way that the power received by each system is always maximized.

The transmitting/receiving system comprises at least the following elements:

- a first integrated circuit 12 which serves to process the baseband modulation signals and to control all the other integrated circuits, notably in order to supply (in principle digital) phase-shift control signals to each of them;
- a stable clock frequency source, implemented in principle in the integrated circuit 12 and stabilized by a quartz crystal 10 outside the integrated circuit; the clock frequency is a very low frequency if it is compared with the carrier frequencies of around 60 GHz transmitted or received by the system; it may, for example, be 36 MHz; the clock signal CLK produced by this source is used by the entire system for timing the operations on the one hand and for stabilizing the carrier frequency on the other hand;
- N integrated circuits 14 (eight in FIG. 1) which are transmitting/receiving circuits, each including at least one phase-locked loop oscillator (PLL) locked with the clock signal CLK, frequency transposition circuits, phase shifters operating in the baseband, a power amplifier (PA) for transmission and a low noise amplifier (LNA) for reception,
- N transmit/receive antennas ANT, each connected to a respective transmit/receive circuit; due to the lack of space in FIG. 1, the antennas are shown for simplification as if they formed part of the transmitting/receiving circuit, but in practice they do not form part of the transmitting/receiving circuit: they are connected to an antenna input/output terminal of the integrated circuit. However, they could in certain cases be formed on their respective transmitting/receiving integrated circuit.

It will then be assumed that there are N antennas at the same time acting as transmit antennas and receive antennas, but it could also be envisaged there are 2N antennas, a separate transmit antenna and a separate receive antenna being associated with each transmitting and receiving integrated circuit.

The common clock signal CLK is applied by the processing circuit 12 to each of the transmitting/receiving integrated circuits 14.

The phase shift of each of the two phase shifters of each integrated circuit 14 is controllable. It is the processing circuit 12 which controls it; digital control connections 16 connect the control circuit to each of the integrated circuits 14 for this purpose.

The integrated circuit 12 may include both a digital control processor and circuits for processing the transmitted or received baseband modulation signal. In FIG. 1, a digital processor 18, an amplification, gain control and transmission filtering circuit 20, and an amplification, gain control and reception filtering circuit 22 are included in the common integrated circuit 12. However, it can also be provided that these different functions are implemented by different integrated circuits. When the modulation signals are produced or received by the system in digital form for the purpose of a radiofrequency transmission, it is the circuit 12 which converts them into analog baseband signals; similarly, on reception, it is the circuit 12 which, following amplification and baseband filtering, converts them back into digital signals.

The signals to be transmitted from the circuit 20 to the different integrated circuits 14 are preferably sent in the form of two quadrature phase baseband signals [I, Q]. They are sent to the circuit 20 in this form by the signal processing circuit 18. The same applies on reception: the signals are received from the circuit 14 in the form of quadrature signals [I, Q] and are transmitted from there to the processing circuit 12 in this form. Each integrated circuit 14 therefore has a double input for the quadrature signals [I, Q] which it must transmit to its respective antenna, and a double output for the quadrature signals which it has received.

The processing integrated circuit 12 and the transmitting/receiving integrated circuits 14 are preferably disposed on a common high-resistivity silicon wafer 24. This wafer 24 comprises a network of conducting interconnections which are preferably disposed on one of the surfaces of the wafer which will be referred to as the back surface, and the antennas ANT are formed on the front surface of this wafer. The interconnection network is used to notably to implement all the connections visible in FIG. 1 between the processing circuit 12 and the transmitting/receiving circuits 14. The antennas are preferably connected to this network or directly to the transmitting/receiving circuits 14 via conductor paths inserted between the front surface and the back surface of the silicon wafer. The wafer may itself be disposed on a printed circuit board and the quartz crystal may be located on this board. This physical structure will be further examined below.

Figure 2:
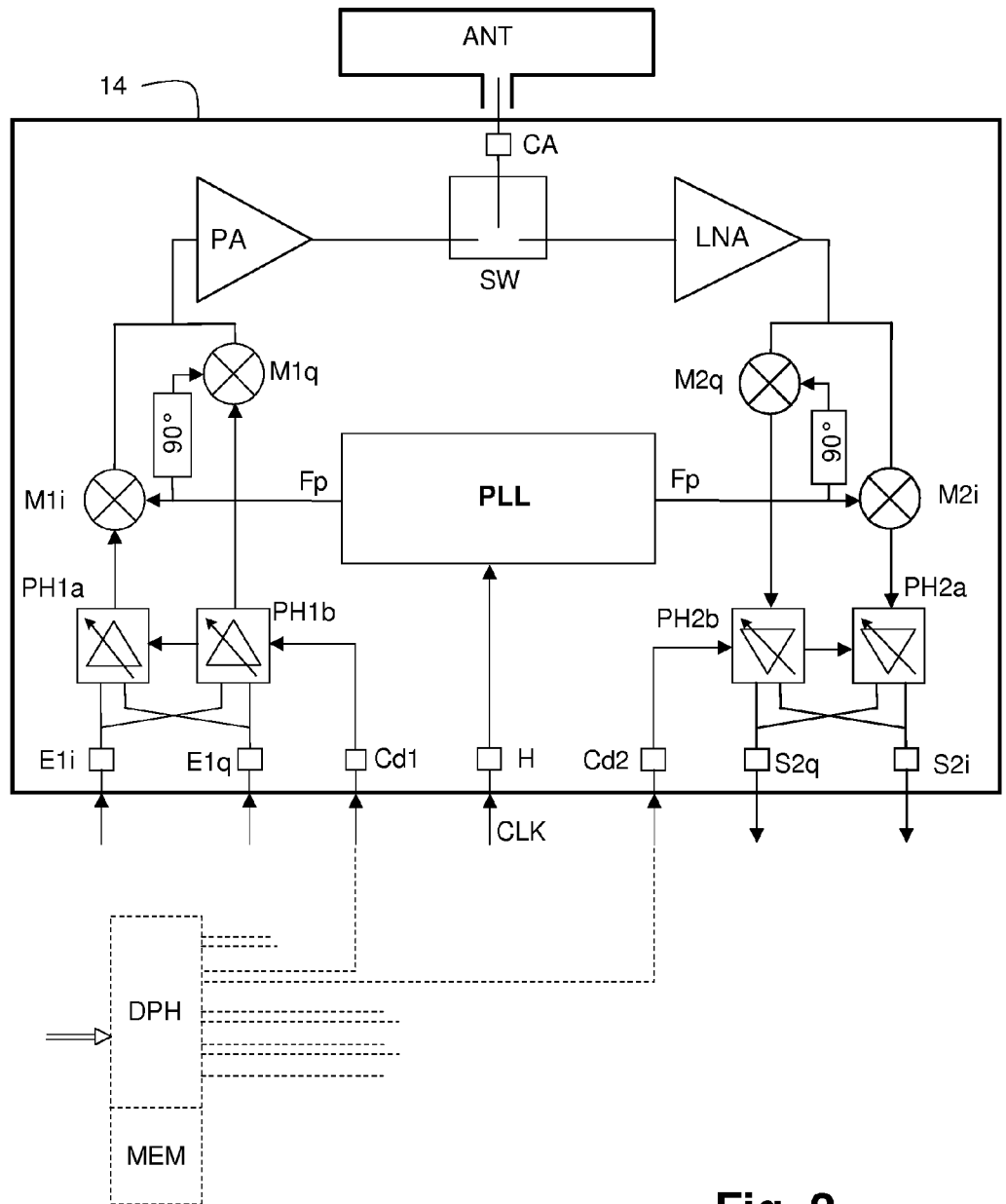
FIG. 2 shows the structure of an individual transmitting/receiving integrated circuit.

FIG. 2 shows the detail of a transmitting/receiving integrated circuit 14. The integrated circuit comprises the following input/output terminals:

- input terminals E1$i$ and E1$q$ to receive from the signal-processing integrated circuit 12 quadrature phase, baseband-modulated signals which will be transposed into the radiofrequency domain before being transmitted by an antenna; all the terminals E1$i$ of the different integrated circuits 14 receive the same first signal, but with a possibility of phase shifting in relation to one other due to the variable distance between the circuit 12 and the different circuits 14; similarly, all the terminals E1$q$ receive from the circuit 12 the same second signal in quadrature phase with the preceding signal;
- output terminals S2$i$, S2$q$ to transmit to the processing circuit 12 modulated signals received in the radiofrequency domain by the antenna and transposed into the baseband; all the output terminals S2$i$ are connected to the same input of the circuit 12, and similarly all the output terminals S2$q$;
- clock terminal H receiving from the circuit 12 (or elsewhere) a clock signal CLK which is the same for all the circuits 14;
- terminal or group of terminals Cd1 receiving from the processing circuit 12 a phase shift control signal to control the phase shift of the baseband signals received on the inputs E1$i$ et E1$q$; the phase shift is the same on the channels I and Q; this control signal acts on a phase shift circuit which is, in this example which will be further examined below, made up of two parts PH1$a$ and PH1$b$; the phase shift control signal received on the terminal Cd1 is individual to each integrated circuit 14, i.e. the processing circuit 12 can force a different phase shift on each integrated circuit 14;
- terminal or group of terminals Cd2 receiving from the processing circuit 12 a phase shift control signal to control the phase shift of the baseband signals before application to the outputs S1$i$ and S1$q$; the phase shift is the same on the channels I and Q; this control signal acts on a phase shift circuit shown here in the form of two parts PH2$a$ and PH2$b$ for the channels I and Q respectively; the phase shift control signal received on the terminal Cd2 is here again individual to each integrated circuit 14, the processing circuit 12 being able to force a different phase shift on each integrated circuit 14;

antenna connection terminal CA to which an antenna ANT outside the integrated circuit 14 is connected; this terminal is connected inside the circuit 14 to an antenna switch SW that switches over according to whether the system is in signal transmit mode or signal receive mode.

The phase shift applied inside an integrated circuit results from two components which are an actual phase shift component connected to the structure and to the position of the integrated circuit in the system, and a beam-forming phase shift component connected to the directivity that it is wished to be given to the overall radiation pattern of the antenna array. The actual phase shifts result notably from the different lengths of the connections which transport the common clock H; they may also result from the differences in the characteristics of the integrated circuits and notably the phase-locked loops of these circuits. The actual phase shift is understood to mean the phase shift between the output signals of the common processing circuit and the antenna of the integrated circuit.

The antenna switch SW has two possible states: a transmit state, in which it receives millimeter band signals from the output of a power amplifier PA to transmit them to the terminal CA; and a receive state, in which it transmits signals received by the antenna to the input of a low noise amplifier LNA.

The input of the power amplifier PA is connected to the output of a frequency transposition circuit which transposes to the millimeter band the modulated signals which have been received by the inputs E1$i$ and E1$q$ and which have been phase-shifted by the controlled phase shifter PH1$a$, PH1$b$. The frequency transposition circuit essentially includes a mixer; as two quadrature phase signals are received, there are in practice two mixers M1$i$ and M1$q$ whose outputs are recombined to regroup the signals at the input of the amplifier PA.

The mixers M1$i$ and M1$q$ each receive a millimeter band carrier frequency produced by a phase-locked loop oscillator PLL. The carrier frequency is applied in phase to the mixer M1$i$ and in quadrature phase to the other mixer M1$q$; this is why a 90° phase shifter is shown in the figure; the oscillator could also supply two outputs in quadrature phase in relation to one another, applied respectively to the inputs of the two mixers. In a conventional manner, the mixers may comprise a plurality of conversion stages to convert progressively rather than in a single step from the baseband to the carrier frequency.

The mixers furthermore receive the phase-shifted baseband modulation signals; they are therefore each connected to a respective output of the phase shifter PH1$a$, PH1$b$.

The carrier-frequency output signals originating from the mixers and recombined with one another are applied to the input of the amplifier PA.

A frequency transposition circuit identical to the previous circuit is provided in the receive channel. It includes two (single-stage or multi-stage) mixers M2$i$ and M2$q$ receiving the output of the low noise receive amplifier LNA. The mixers furthermore receive the reference carrier frequency originating from the phase-locked loop oscillator PLL. It is the same frequency as for transmission. This carrier frequency is applied to the mixer M2$i$, and is applied following 90° phase shifting to the mixer M2$q$. The outputs of the mixers are applied to the inputs of the controllable phase shifter PH2$a$, PH2$b$. The in-phase and quadrature-phase outputs of the phase shifter PH2$a$, PH2$b$ are applied to the output terminals S2$i$ and S2$q$ respectively.

The oscillator PLL is locked in frequency and phase with the clock signal CLK which it receives. The carrier frequency Fp which it produces is a multiple of the clock frequency; it is the same for all of the circuits 14 since the latter all receive the same clock frequency; a locking signal is obtained in each integrated circuit 14 through division of the carrier frequency and phase locking with the clock frequency. The phases of the carriers thus produced in the different integrated circuits may differ from one another if the oscillators PLL are different and also if the integrated circuits receive a clock with phase deviations in relation to one another.

Figure 3:
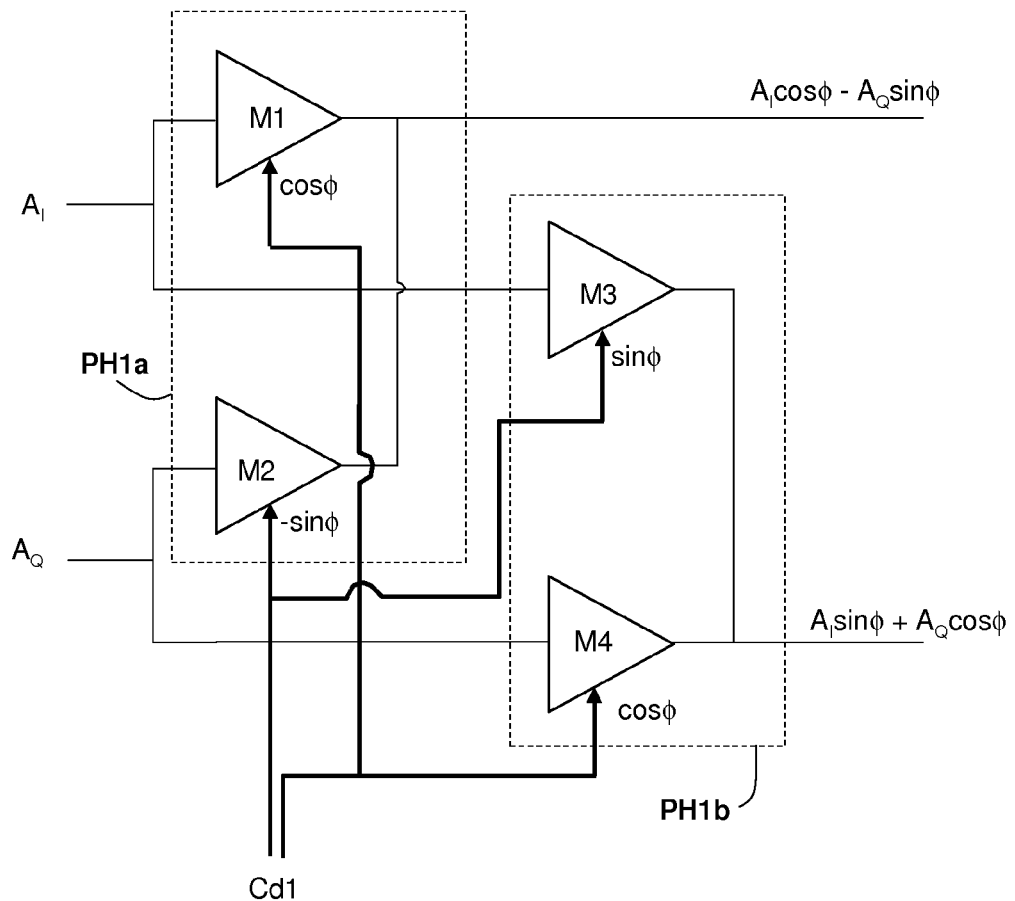
FIG. 3 shows a possible phase shifter structure.

FIG. 3 shows schematically the structure of a controllable phase shifter. It receives quadrature-phase signals $A_I$ and $A_Q$, for example the signals received on the inputs E1$i$ and E1$q$, and it receives a digital control to regulate the phase shift φ. This control is applied in the form of two gain values to two groups of controllable-gain amplifiers M1, M2 and M3, M4. The amplifiers M1 and M2 make up one group and correspond to the phase shifter PH1$a$ in FIG. 2. The amplifiers M3 and M4 make up another group corresponding to the phase shifter PH1$b$ in FIG. 2. The two groups receive the quadrature-phase signals $A_I$ and $A_Q$ and each of the groups produces a respective output signal, phase-shifted by φ in relation to the inputs and in quadrature-phase with the output signal of the other group.

More precisely, the amplifier M1 receives the signal $A_I$ and the digital gain control imposes on it a gain having a value cos φ; the amplifier M2 receives the signal $A_Q$ and the digital control imposes on it a gain having a value −sin. The outputs of the two amplifiers are combined to produce a signal with an amplitude $A_I$ cos φ−$A_Q$ sin φ. For the other phase shifter PH1$b$: the amplifier M3 receives the signal $A_I$ and the digital gain control imposes on it a gain sin φ; the amplifier M2 receives the signal $A_Q$ and the digital control imposes on it a gain +cos φ. The outputs of the two amplifiers are combined to produce a signal with an amplitude $A_I$ sin φ+$A_Q$ cos φ.

The outputs of the two phase shifters represent the signal $A_I$, $A_Q$ phase-shifted by in relation to the signal at the input of the phase shifter.

If a phase shift between 0 and 45° in steps of 11.25 degrees (/16) is required, 5 cosine values can be used for the amplifiers having a cosine gain, and 5 sine values for amplifiers having a sine gain. For a phase shift beyond 45°, switches can be used to cross the connections of the amplifiers (for example to exchange the amplifiers having a sine gain with the amplifiers having a cosine gain). This limits the possible gain values of the different amplifiers to five, while allowing a phase shift between 0° and 360°.

Figure 4:
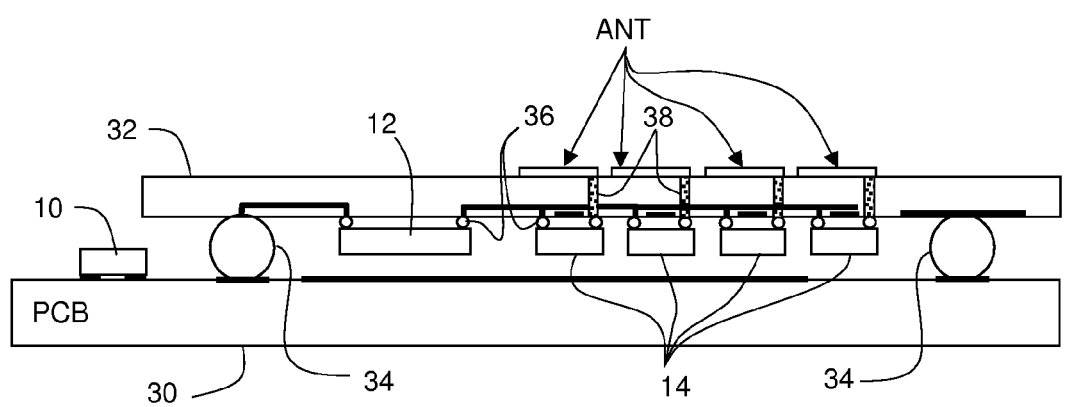
FIG. 4 shows a physical implementation of the system.

FIG. 4 shows schematically the preferred physical structure of the system of which the general architecture has just been described.

The system as a whole is mounted on a plastic or ceramic printed circuit board 30 carrying interconnection conductors. An intermediate silicon wafer 32 is soldered onto the board 30 using solder balls 34. The silicon wafer also carries on its lower surface (surface turned towards the board 30) a network of interconnection conductors, preferably a multi-layer network formed by conventional microelectronic deposition and etching processes. The integrated circuit chip 12 (baseband signal processing and control processor) and the integrated circuits 14 (transmitting/receiving circuits) are soldered onto this lower surface. The soldering is a flip-chip soldering using low-height solder balls 36. The solder balls 34 which connect the silicon wafer 32 to the board 30 are higher than the balls 36 and serve as spacers to establish a sufficient space between the board 30 and the wafer 32 to accommodate the integrated circuits 12 and 14, including the thickness of the solder balls 36.

The silicon wafer 32 is made from high-resistivity, i.e. effectively insulating, silicon, allowing it to serve as a substrate for patch antennas. The patch antennas ANT include metal portions deposited and etched onto the upper surface of the wafer. Conductor paths 38 are formed across the entire thickness of the wafer in order to connect these patch antennas to the integrated circuits 14, directly if the path is formed above a solder ball 36, or indirectly across the back-surface interconnection network of the wafer 32.

The spacing between the centers of the adjacent antennas ANT is preferably equal to or approximately equal to the half-wavelength of the carrier frequency in order to facilitate the formation of a coherent radiation beam in one spatial direction.

One or more ground planes can be formed in the back-surface interconnection network facing the patch antennas ANT.

Dense-network conductor paths, all connected to a ground plane, can help to form an electromagnetic cavity at the back of the antenna, assisting the radiation of the latter.

The clock frequency stabilization crystal outside the integrated circuits can be placed directly on the printed circuit board 30.

The phase shift control of each integrated circuit 14, both transmitting and receiving, is established by the processing circuit 12 according to a measurement process, the function of which is to determine the best beam direction that it is appropriate to give to the overall antenna (array of the antennas ANT transmitting in parallel the same modulated, more or less phase-shifted, signal) in order to maximize the power budget of the link.

According to the prevailing standards, a communication is first preceded by a received power observation protocol, which is a dialogue between two communicating systems. The best solution to be given to the antenna phase shifts is determined by means of this protocol. The communication is then continued with this distribution, which is regularly checked by adjusting it, if necessary, by means of a monitoring protocol.

Given that each transmitting/receiving integrated circuit has its own frequency synthesis, with inevitable phase shifts, a prior calibration is preferably carried out in order to determine and compensate these phase shifts, so that the digital command of the phase shifters ends in the formation of a coherent beam in one spatial direction despite these shifts. The compensation shifts that must be applied systematically by the phase shifters in addition to the phase shifts linked to the required radiation pattern directivity will therefore be determined in this calibration phase. The compensation shifts, or actual phase shifts of the integrated circuits, are linked to both the structure of the integrated circuit and to their position in the system, since the connection lengths play a part in these phase shifts.

The system preferably comprises (FIG. 2) a memory MEM (shown by dotted lines) containing the actual phase shifts of the different integrated circuits obtained in the calibration phase, and a phase shift control calculation circuit DPH. The calculation circuit uses the data from the memory and also directivity reference phase shifts in order to produce the phase shift control signals applied to the terminals Cd1, Cd2 (mentioned with reference to FIG. 2) of the integrated circuit. The memory MEM and the phase shift control calculation circuit DPH preferably form part of the common processing circuit. In one alternative embodiment, it could be envisaged that the memory MEM and the calculation circuit are distributed in the integrated circuits, the phase shift control terminals Cd1, Cd2 receiving the references and the calculation of the compensated phase shift control being carried out within the integrated circuit.

In the calibration phase, the transmit and receive amplifiers will be made to operate simultaneously. The insulation between the transmit and receive channels is not perfect, in particular at the location of the antenna switch SW; consequently, the receive channel will collect a fraction, for example −30 dB, of the transmitted signal; this fraction will be collected by the receive channel and will be used for calibration; for a signal transmitted at 0 dBm, the fraction returned, 30 dBm, is sufficient for the measurement. If there is no antenna switch, a directive coupler can be provided in the transmit channel to extract a small part of the signal to be transmitted and send it to the receive channel for calibration purposes.

The signal undergoes a different phase shift in the different integrated circuits 14 due to the phase differences of the synthesized frequencies.

The recombined signal on the outputs of the N integrated circuits is written as follows:

$$S_r(t) = s(t) \sum_{k=1}^{N} e^{j(2*\varphi_{OLk} + \varphi_{Txk} + \varphi_{Rxk} + \omega \tau)}$$

where S(t) is the transmitted signal, $S_r(t)$ the recombined signal, the pulsation, $\phi_{OLk}$ the actual phase shift of the frequency synthesis of the integrated circuit 14 of order k (k=1 to N), i.e. the phase shift (related to the carrier frequency) between the clock signal and the output of the oscillator PLL, $\phi_{Txk}$ and $\phi_{Rxk}$ are the phase shifts applied to the phase shifters of the transmit and receive channels of this circuit, and τ is the propagation delay of the millimeter band in the transmitting/receiving circuit in loopback mode.

Via a test or learning sequence, by varying the phase shifts applied to the transmitter and/or to the receiver, the relative phase shifts between the frequency syntheses can be obtained through calibration.

A first calibration method may consist in varying the phase shifts of the transmitting and then the receiving phase shifters by giving them all types of possible values $\phi_{Txi}$ (transmission) and $\phi_{Rxi}$ (reception) until a structural signal is obtained:

$$\max_{\varphi_{Txi}, \varphi_{Rxi}} \left( \int_0^T \left\| s(t) \sum_{k=1}^{N} e^{j(2*\varphi_{OLk} + \varphi_{Txi} + \varphi_{Rxi} + \omega k \tau)} \right\| \right)$$

This solution may require a long integration time, since it is necessary to evaluate the power received in each of the (2*N²) configurations over an integration time T if there are N transmitting/receiving circuits.

One method preferable to the preceding method consists in estimating directly the relative phase shifts between the channels by applying to the transmit and receive channels a limited number of sets of phase shifts having mutual orthogonality properties. The columns of a Hadamard N×N matrix, for example, can be used as the set of successive phase shifts, the columns of such a matrix having the property of being vectors orthogonal in relation to one another (product of a row vector by a zero column vector except if the rank of the row and column are identical).

Example of a Hadamard matrix for N=8 channels:

$$H = \begin{bmatrix} 1 & 1 & 1 & 1 & 1 & 1 & 1 & 1 \\ 1 & -1 & 1 & -1 & 1 & -1 & 1 & -1 \\ 1 & 1 & -1 & -1 & 1 & 1 & -1 & -1 \\ 1 & -1 & -1 & 1 & 1 & -1 & -1 & 1 \\ 1 & 1 & 1 & 1 & -1 & -1 & -1 & -1 \\ 1 & -1 & 1 & -1 & -1 & 1 & -1 & 1 \\ 1 & 1 & -1 & -1 & -1 & -1 & 1 & 1 \\ 1 & -1 & -1 & 1 & -1 & 1 & 1 & -1 \end{bmatrix}$$

For N transmitting/receiving integrated circuits 14, N test signal samples are applied (or even several times N samples if the measurement is to be refined by an averaging of the results). For one sample, the phase shifters of the N transmit channels are controlled according to a set of N phase shift values corresponding to a column of the matrix; for the following sample, the phase shifters are controlled according to a different set corresponding to a different column; and so on: the N sets of possible phase shifts, i.e. the N columns of the matrix H, are used, and the sets are orthogonal in relation to one another.

The value 1 represents a zero phase shift; the value −1 represents a phase shift of 180°. Other values could be chosen, but these values are the ones that most simplify the calculations.

The same set, which is the first column of the matrix, i.e. phase shifts that are identical and always zero, is preferably always applied to the receive channels.

For each transmitted signal sample, a corresponding received signal sample is collected, which means that the receive channel is made to operate at the same time as the transmit channel as previously explained.

A vector Y of N received signal values is therefore made to correspond to a vector X of N transmitted signal values.

The integrated circuit 12 comprises the means for transmitting the vector X of N samples on all the channels simultaneously, in the baseband, the means for modifying each time the phase shifts of the N transmit channels, and the means for performing the carrier frequency phase shift calculations from the Hadamard matrix, the vector X and the vector Y. The vectors X and Y are supposed to be reduced in amplitude to a unit value.

If the carrier frequency phase shifts of the N integrated circuits are represented by a vector comprising N components, the following can be written:

$$Y = X \otimes H \cdot \phi$$

The period in this equation denotes a matrix multiplication, the $\otimes$ being a term-by-term multiplication.

The phase shifts of the vector $\phi$ mainly represent double the actual phase shift introduced by the oscillator since this phase shift occurs in transmission and in reception. The actual phase shift is counted in relation to the clock signal CLK. Here, it is supposed that the phase shift introduced by the propagation delay of the clock from one circuit to another is negligible, the calculation being slightly more complicated if it is to be taken into account, especially if it is not identical for all the circuits.

Due to the orthogonality of the matrix H, it can be written, by multiplying the preceding equation by the transpose $^tH$ of this matrix:

$$^tH \cdot Y = X \otimes N \cdot I_N \cdot \phi$$

where $I_N$ is the identity matrix N×N

The phase shift vector $\phi$ is derived directly from this equation:

$$\phi = (1/2N)^tH \cdot Y \otimes (1/X),$$

where 1/X denotes a vector of which each component is the inverse of a respective component of the samples vector X; the period again denotes a matrix multiplication and the symbol $\otimes$ a term-by-term multiplication.

The complexity of the calculation is moderated due to the fact that the Hadamard matrix includes only simple values +1 and −1.

It will be noted that a similar method can also be applied to calibrate the gain variations that may exist between the different transmit or receive channels.

Following this calibration, the processing circuit 12 stores the actual phase shift values of the different integrated circuits 14 and takes account of these phase shifts to subsequently apply phase shift references in order to form a coherent beam in a given spatial direction: the processor subtracts the actual phase shift value of the integrated circuit from the reference value which it would have to do apply to this circuits if there were no actual phase shift.

The phase shift values that are to be applied are typically values varying by steps of 22.5° (π/8), with a precision of + or −12° in phase and + or −1 dB in gain.

The calibration phase may be carried out with algorithms contained in the transmitting/receiving system (in the common processing circuit) or with algorithms from a test bench of the system. In both cases, the measured phase shifts remain present in the memory MEM of the transmitting/receiving system.

The invention claimed is:

1. A contactless millimeter band transmitting/receiving system for a high-speed data transmission, including a common processing circuit supplying modulation signals and a plurality of transmitting/receiving integrated circuits, all transmitting/receiving circuits being identical to one another, and being electrically connected to the common processing circuit in order to receive from it said modulation signals, and all transmitting/receiving circuits receiving a common clock signal originating from a common clock signal source, the transmitting/receiving integrated circuits each comprising:
   an oscillator locked on the clock signal and producing a carrier frequency which is a multiple of the clock signal,
   a transmit channel comprising a first controllable phase shift circuit, a first circuit for frequency transposition of a signal to be sent to the carrier frequency, and a power amplifier,
   a receive channel comprising a low noise amplifier, a second circuit for frequency transposition of a received signal from the carrier frequency, and a second controllable phase shift circuit,
   the system also comprising, for each transmitting/receiving integrated circuit, at least one respective antenna connected to the transmit and receive channels of said transmitting/receiving circuit.

2. The transmitting system as claimed in claim 1, wherein the antenna is located on the transmitting/receiving integrated circuit.

3. The transmitting/receiving system as claimed in claim 1, wherein the antenna is located outside the transmitting/receiving integrated circuit and is connected to an antenna connection terminal of said transmitting/receiving integrated circuit.

4. The system as claimed in claim 3, wherein the transmitting/receiving integrated circuit comprises a transmitting/receiving switch connected to said antenna connection terminal to connect said terminal either to an output of the power amplifier of the transmit channel or to an input of the low noise amplifier of the receive channel.

5. The system as claimed in claim 1, wherein the transmitting/receiving integrated circuits are attached to a back surface of a high-resistivity silicon wafer comprising on said back surface a network of interconnection conductors connected to said transmitting/receiving integrated circuits, said antennas associated to the transmitting/receiving circuits being formed on a front surface of said high-resistivity silicon wafer and been connected to the network of interconnection conductors via conductive vias crossing an entire thickness of the wafer.

6. The system as claimed in claim 1, wherein each transmitting/receiving integrated circuit comprises a transmission and reception gain control to optimize consumption when it is not necessary to use all the available transmission power.

7. The system as claimed in claim 1, wherein means are provided in each transmitting/receiving integrated circuit to switch off a power supply of the amplifiers when it is not necessary to use all the transmitting or receiving circuits.

8. The system as claimed in claim 1, wherein the common processing circuit includes means for determining in a calibration phase actual carrier frequency phase shifts of the respective transmitting/receiving integrated circuit, as a function of their structure and their position in the system.

9. The system as claimed in claim 8, further including a memory for storing the actual carrier frequency phase shifts determined during the calibration phase.

10. The system as claimed in claim 8, wherein the means for determining the actual carrier frequency phase shifts include:
    means for applying to the transmit channel of the N circuits a sequence of N successive test signal samples, represented by a vector X comprising N components,
    means for applying a set of N simple phase shifts to the N phase shift circuits of the transmit channels at the time of transmission of a sample, the set of N simple phase shifts being chosen from N possible sets differing from one another and orthogonal in relation to one another, the N sets being applied successively, simultaneously with the application of the N samples of the sequence,
    means for collecting a vector Y of N corresponding successive signal samples on a receive channel coupled to the transmit channel,
    and means for calculating a vector $\Phi$ of phase shifts of the carrier frequencies of the N circuits by means of an equation $\Phi=(1/2N)^t H \cdot Y \otimes (1/X)$, where $^t H$ denotes the transpose of a matrix H representing the N possible sets of N phase shifts, 1/X denotes a vector of which the components are the inverse of each of the components of the vector X, and the symbol $\otimes$ denotes a term-by-term multiplication of the vector components.

11. A method for using a contactless millimeter band transmitting/receiving system for a high-speed data transmission, including a common processing circuit supplying modulation signals and a plurality of transmitting/receiving integrated circuits all identical to one another, electrically connected to the common processing circuit to receive the modulation signals from it, moreover all receiving a clock signal originating from a common clock signal source, the integrated circuits each being connected to at least one respective antenna and each including a phase-locked loop, frequency transposition circuits and controllable phase shift circuits, the method comprising a calibration step for determining actual phase shifts of the respective integrated circuits, and a step of storing in a memory of said actual phase shifts, and a subsequent use of the actual phase shifts stored in the memory in order to modify phase shift control signals supplied to the integrated circuits by the common processing circuit.

12. A method for using a contactless millimeter band transmitting/receiving system for a high-speed data transmission system, the system including a common processing circuit supplying modulation signals and a plurality of transmitting/receiving integrated circuits, all transmitting/receiving circuits being identical to one another, and being electrically connected to the common processing circuit in order to receive from the common processing circuit said modulation signals, and all transmitting/receiving circuits receiving a common clock signal originating from a common clock signal source, the transmitting/receiving integrated circuits each including an oscillator locked on the clock signal and producing a carrier frequency which is a multiple of the clock signal, a transmit channel comprising a first controllable phase shift circuit, a first circuit for frequency transposition of a signal to be sent to the carrier frequency, and a power amplifier, a receive channel comprising a low noise amplifier, a second circuit for frequency transposition of a received signal from the carrier frequency, and a second controllable phase shift circuit, the system also comprising, for each transmitting/receiving integrated circuit, at least one respective antenna connected to the transmit and receive channels of said transmitting/receiving circuit, the method comprising:
    a calibration step for determining actual phase shifts of the first and second controllable phase shift circuits of the respective integrated circuits, and
    a step of storing in a memory of said actual phase shifts, and a subsequent use of the actual phase shifts stored in the memory in order to modify phase shift control signals supplied to the first and second controllable phase shift circuits of the integrated circuits by the common processing circuit.

* * * * *